United States Patent
Mizuno et al.

(10) Patent No.: US 7,807,561 B2
(45) Date of Patent: Oct. 5, 2010

(54) METHOD FOR FORMING SIDE WIRINGS

(75) Inventors: Shigeru Mizuno, Nagano (JP); Takashi Kurihara, Nagano (JP); Akinori Shiraishi, Nagano (JP); Kei Murayama, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 264 days.

(21) Appl. No.: 12/175,650

(22) Filed: Jul. 18, 2008

(65) Prior Publication Data

US 2009/0023247 A1   Jan. 22, 2009

(30) Foreign Application Priority Data

Jul. 20, 2007   (JP)   ............................. 2007-190040

(51) Int. Cl.
 *H01L 21/44* (2006.01)
(52) U.S. Cl. ..................................... 438/617
(58) Field of Classification Search ................. 257/686, 257/784; 438/107, 617
 See application file for complete search history.

(56) References Cited

U.S. PATENT DOCUMENTS 6,445,063 B1 * 9/2002 King et al. .................. 257/686
7,180,168 B2 * 2/2007 Imai ........................... 257/686

FOREIGN PATENT DOCUMENTS

JP   2001-514449   9/2001

* cited by examiner

*Primary Examiner*—Kiesha R Bryant
*Assistant Examiner*—Jenny L Wagner
(74) *Attorney, Agent, or Firm*—Drinker Biddle & Reath LLP

(57) ABSTRACT

After plural semiconductor elements are stacked to form a stacked body P, side wirings are formed on the side surface of the stacked body P, thereby manufacturing a semiconductor apparatus in which the respective semiconductor elements are electrically connected to one another. In this case, as the semiconductor element, a semiconductor element 10 is employed in which a gold wire 16 with its one end connected to an electrode terminal of the semiconductor element is extended out to the side surface. A conductive paste 36 containing conductive particles applied over a predetermined length of a transferring wire 30 is transferred to the side surface of the stacked body P so that the gold wires 16 extended out to the side surfaces of the semiconductor elements 10, 10, 10 are connected, thereby forming the side wirings.

9 Claims, 8 Drawing Sheets

METHOD FOR FORMING SIDE WIRINGS

BACKGROUND OF THE INVENTION

This invention relates to a method for forming side wirings, and more particularly to a method for manufacturing a semiconductor apparatus in which plural semiconductor elements are stacked to form a stacked body and thereafter side wirings are formed on the side surface of the stacked body to electrically connect the semiconductor elements to one another.

For example, the following Patent Reference 1 proposes the semiconductor apparatus in which plural semiconductor elements are stacked to form a stacked body and thereafter side wirings are formed on the side of the stacked body to electrically connect the semiconductor elements to one another.

Such side wirings for the semiconductor apparatus, as shown in FIG. 14, can be formed in such a way that a conductive paste containing conductive particles is spit out from a nozzle 102 to form linear strips 104, 104, . . . of the conductive paste along the side surface of a stacked body A formed by stacking semiconductor elements 100, 100, . . . and thereafter the linear strips 104, 104, . . . thus formed are heat-treated.

[Patent Reference 1] JP-T-2001-514449

As shown in FIG. 14, using the conductive paste, the side wirings can be easily formed on the side surface of the stacked body A.

However, as shown in FIG. 14, the thickness of the side wiring formed by spitting out the conductive paste from the nozzle 102 depends on the diameter of the nozzle 102. On the other hand, if the diameter of the nozzle 102 is excessively decreased, the conductive paste may become incapable of being continuously spitted out according to its viscosity. Thus, there is a limit in decreasing the diameter of the nozzle 102 and also there is a limit in decreasing the side wiring formed.

On the other hand, in recent years, the semiconductor apparatus has also been required to have a larger capacity and a higher density. The side wirings have been also demanded to be formed at narrow pitches. As a result, the nozzle 102 as shown in FIG. 14 is becoming incapable of being used.

SUMMARY OF THE INVENTION

Accordingly, this invention intends to solve a problem of a conventional method for manufacturing a semiconductor apparatus in which only thick side wirings can be formed at wide pitches by spitting out a conductive paste from a nozzle, and to provide a method for manufacturing a semiconductor apparatus in which thin side wirings can be formed at narrow pitches.

The inventors of this invention, as a result of having made an elaborate investigation in order to solve the above problem, have found that as compared with the side wirings formed by spitting out the conductive paste from the nozzle, thin side wirings can be formed by transferring the conductive paste applied over a prescribed length of a transferring wire onto the side surface of a stacked body formed by stacking plural semiconductor elements.

According to a first aspect of the invention, there is provided a method for manufacturing a semiconductor apparatus including the steps of:

staking plural semiconductor elements to form a stacked body, forming side wirings on a side surface of the stacked body to manufacture the semiconductor apparatus in which the respective semiconductor elements are electrically connected to one another, as the semiconductor element, preparing a semiconductor element in which at least a part of a wiring with one end thereof connected to an electrode terminal of the semiconductor element is extended out or exposed to the side surface; and transferring a conductive paste containing conductive particles applied over a predetermined length of a transferring wire to the side surface of the stacked body so that the wirings extended out to the side surfaces of the semiconductor elements are connected to form the side wirings.

According to a second aspect of the invention, there is provided the method for manufacturing a semiconductor apparatus according to the first aspect, wherein as the semiconductor element, a semiconductor element is employed in which at least a part of the wiring with one end thereof connected to an electrode terminal formed on one main surface thereof is extended out to the side surface.

Particularly, according to a third aspect of the invention, there is provided the method for manufacturing a semiconductor apparatus according to the first or second aspect, wherein as the semiconductor element, a semiconductor element is employed in which a wiring with one end thereof connected to an electrode terminal formed on one main surface of the semiconductor element is extended out to the side surface while being in contact therewith.

The wettability between the wiring and the conductive paste is satisfactory. For this reason, when the wiring extended out to the side surface of the semiconductor element is brought into contact with the conductive paste, the conductive paste is likely to be collected on the periphery of the wiring so that contact of the pertinent side wiring with an adjacent side wiring can be avoided. Thus, reliability of the semiconductor apparatus finally produced can be improved.

According to a forth aspect of the invention, there is provided the method for manufacturing a semiconductor apparatus according to the third aspect, wherein as the semiconductor element in which a wiring with one end thereof connected to an electrode terminal is extended out to the side surface while being in contact therewith, a semiconductor element is employed in which after the wiring is wire-bonded in a shooting-up system of connecting the other end of the wiring with the one end connected to a metallic foil on which the semiconductor element is mounted so that an electrode terminal forming surface with the electrode terminal formed thereon serves as an upper surface, to the electrode terminal of the semiconductor element;

the semiconductor element is rotated so that the wiring is brought into contact with the side surface of the semiconductor element; and the wiring is cut at a predetermined position.

Further, according to a fifth aspect of the invention, there is provided the method for manufacturing a semiconductor apparatus according to the first or second aspect, wherein as the semiconductor element, a semiconductor element is employed in which a wiring with one end thereof connected to an electrode terminal formed on one main surface of the semiconductor element crosses the side surface while being in contact therewith and is extended out to a surface opposite to the one main surface.

According to a sixth aspect of the invention, there is provided the method for manufacturing a semiconductor apparatus according to the fifth aspect, wherein as the semiconductor element with a wiring crossing the side surface while being in contact therewith and extending out to a surface opposite to an electrode terminal forming surface, a semiconductor element is employed in which after the wiring is wire-bonded in a shooting-up system of connecting the other end of the wiring with the one end connected to a metallic foil on which the semiconductor element is mounted so that the electrode terminal forming surface with the electrode terminal formed thereon serves as an upper surface, to the electrode terminal of the semiconductor element;

the semiconductor element is rotated or slid so that the wiring is brought into contact with the side surface of the semiconductor element and with the surface opposite to the electrode terminal forming surface; and the wiring is cut at a predetermined position.

According to a seventh aspect of the invention, there is provided the method for manufacturing a semiconductor apparatus according to any one of the first to sixth aspects, wherein in transferring the conductive paste applied on the transferring wire to the side surface of the stacked body, the transferring wire is rotated while being supplied with tension. Thus, the entire quantity of the conductive paste applied on the periphery of the transferring wire can be transferred, thereby providing side wirings having a uniform thickness.

According to an eighth aspect of the invention, there is provided the method for manufacturing a semiconductor apparatus according to any one of the first to seventh aspects, wherein the transferring wire is a metallic transferring wire.

According to a ninth aspect of the invention, there is provided the method for manufacturing a semiconductor apparatus according to the first aspect, wherein the wiring is a metal wiring.

In this invention, side wirings are formed by transferring the conductive paste containing conductive particles applied over a prescribed length of a transferring wire onto the side surface of a stacked body formed by stacking plural semiconductor elements. For this reason, as compared with the side wirings formed by spitting out the conductive paste from the nozzle, thin side wirings can be formed. As a result, the side wirings can be formed at narrow pitches on the side surface of the stacked body, thereby providing a semiconductor apparatus with a large capacity and high density.

DETAILED DESCRIPTION OF THE PREFERRED EMBODIMENTS

Figure 1:
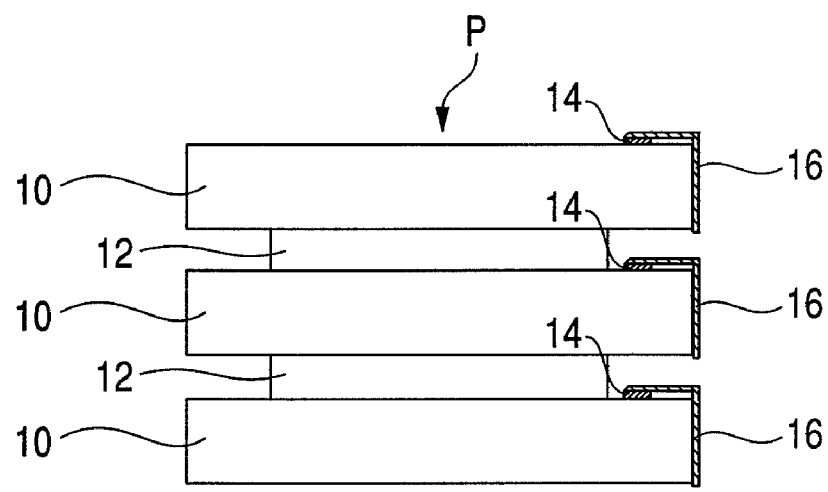
FIG. 1 is a schematic sectional view for explaining an example of a stacked body P employed in this invention.

In this invention, first, as shown in FIG. 1, plural semiconductor elements 10, 10, 10 are stacked to form a stacked body P through adhesive layers 12.

In such a semiconductor element 10, a gold wire 16 serving as a metallic wire with its one end connected to an electrode terminal 14 formed on the one main surface is extended out to the side surface of the semiconductor element while being in contact therewith. In stacking these semiconductor elements 10, 10, 10 to form the stacked body P, the position of each semiconductor element 10 is adjusted so that the gold wire 16 extended out to the side surface of the semiconductor element is linearly arranged.

Figure 2:
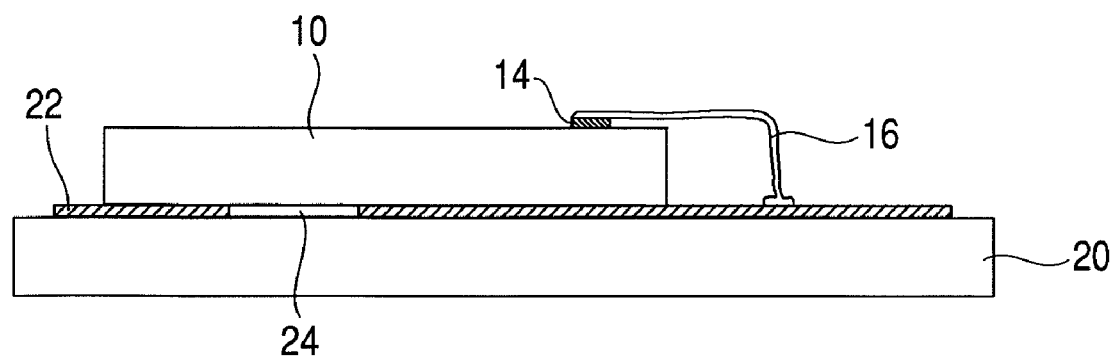
FIG. 2 is a process view for explaining a step of the process for manufacturing the semiconductor element 10 constituting the stacked body P shown in FIG. 1.

In order to form the semiconductor element 10 shown in FIG. 1, as shown in FIG. 2, a metallic foil 22 such as an aluminum foil is placed on a sucking plate 20 and the semiconductor element 10 is placed on a through-hole 24 made in the metallic foil 22. The semiconductor element 10 is placed on the metallic foil 22 so that an electrode terminal forming surface on which its electrode terminal 14 is formed is an upper surface.

Further, the metallic foil 22 and semiconductor element 10 is fixed to a predetermined place of the sucking plate 20 with the aid of the sucking force of the sucking plate 20. In this case, the semiconductor element 10 is sucked and fixed to a predetermined place of the sucking plate 30 through the through-hole 24 of the metallic foil 22.

By a wire bonder, the one end of the gold wire 16 is connected to the vicinity of the semiconductor element 10 of the metallic foil 22 fixed by the sucking force of the sucking plate 20. Thereafter, the gold wire 16 is pulled out from a capillary to connect its other end onto the electrode terminal 14 of the semiconductor element 10 and torn off.

Figure 3A:
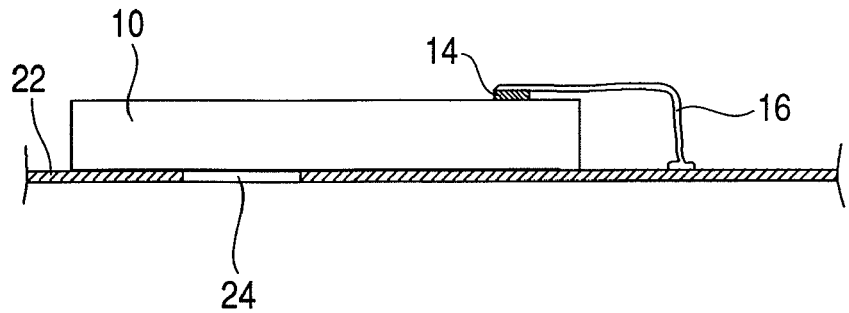
FIG. 3 is a process view for explaining the remaining steps for manufacturing a semiconductor element 10 constituting a stacked body P shown in FIG. 1.

Next, as shown in FIG. 3A, the sucking of the sucking plate 20 is released to take out the semiconductor element 10 and metallic foil 22 from the sucking plate 20. When the sucking of the sucking plate 20 is released, the semiconductor element 10 becomes movable.

Figure 3B:
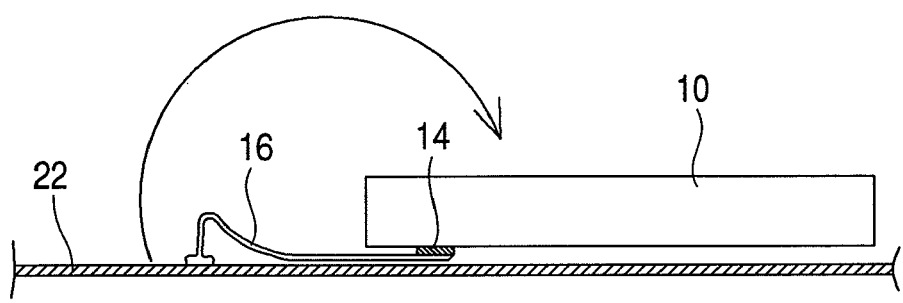

Thus, as shown in FIG. 3B, the semiconductor element 10 is rotated by 180° so that the electrode terminal forming surface is oriented toward the metallic foil 22 (toward the lower surface).

Figure 3C:
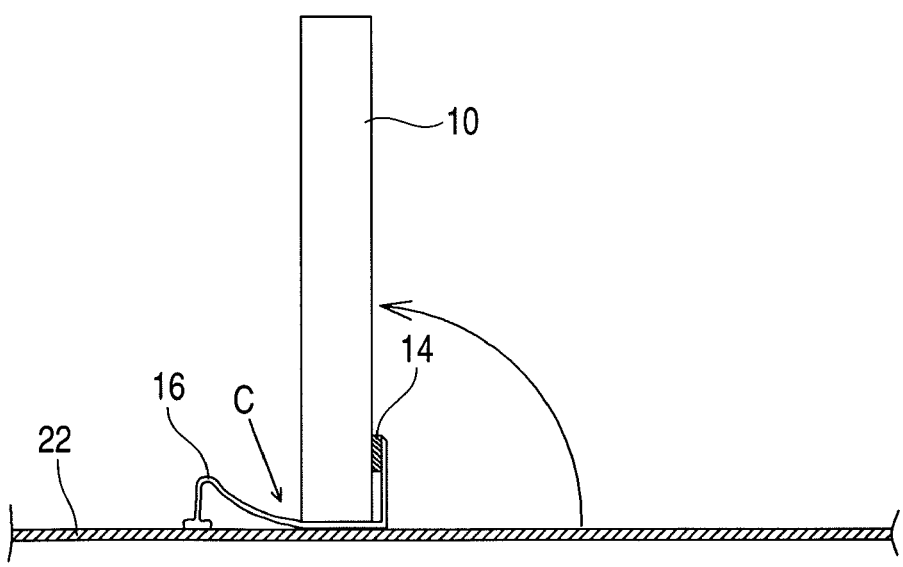

Next, as shown in FIG. 3C, in order that the side surface of the semiconductor element 10, on the side of the electrode terminal 14 to which the one end of the gold wire 16 is connected, is brought into contact with the gold wire 16, the semiconductor element 10 is rotated by 90°. Thereafter, the gold wire 16 is cut at the position in the vicinity of the surface opposite to the electrode terminal forming surface of the semiconductor element 10 (position C indicated by arrow in FIG. 3C). Thus, there can be provided the semiconductor element 10 in which the gold wire 16 with its one end connected to the electrode terminal 14 is extended out to the side surface of the semiconductor element 10 while being in contact therewith.

Meanwhile, the gold wire 16 shown in FIG. 2 is wire-bonded in a direction from the metallic foil 22 to the electrode terminal 14 of the semiconductor element 10, i.e. in a "shooting-up system". In this way, according to the wire bonding in the shooting-up system, the rise of the gold wire 16 on the electrode terminal 14 of the semiconductor element 10 can be made small to the utmost. Therefore, as shown in FIG. 3B, when the semiconductor element 10 is rotated by 180° so that the electrode terminal forming surface is oriented toward the metallic foil 22 (toward the lower surface), the gold wire 16 in the vicinity of the electrode terminal 14 can be prevented from being crushed by the metallic foil 22.

Figure 4A:
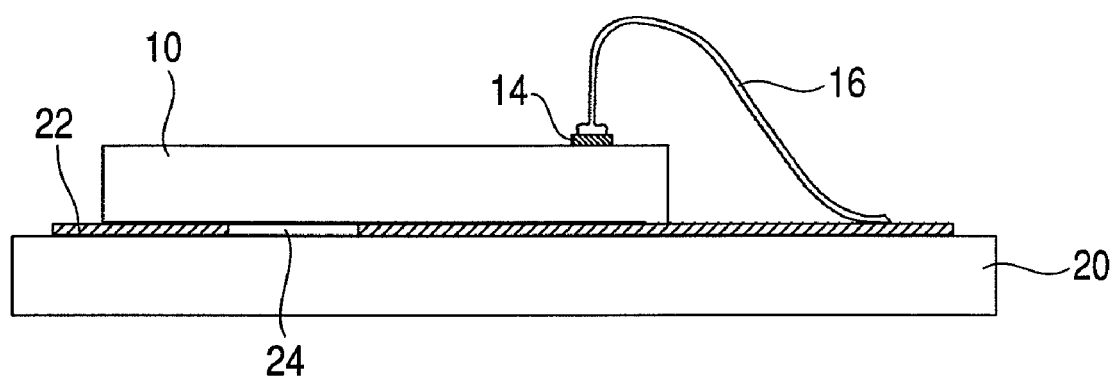
FIG. 4 is a view for explaining a comparative example for the step shown in FIG. 2.
Figure 4B:
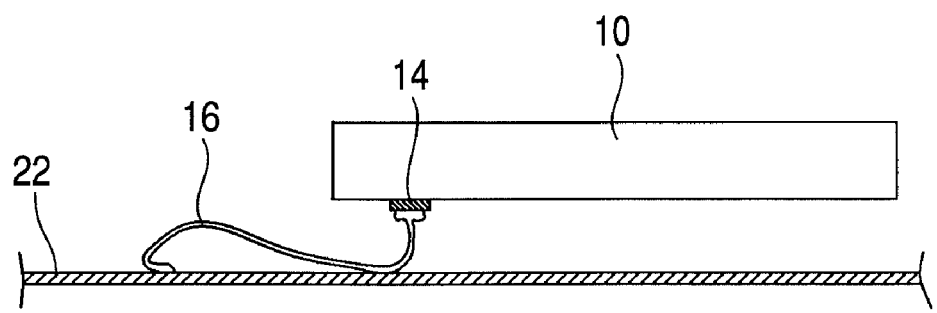

On the other hand, as shown in FIG. 4A, if the gold wire 16 is wire-bonded in a direction from the electrode terminal 14 of the semiconductor element to the metallic foil 22, i.e. in a "shooting-down system", the rise of the gold wire 16 on the electrode terminal 14 of the semiconductor element 10 becomes large. Therefore, as shown in FIG. 4B, when the semiconductor element 10 is rotated by 180° so that the electrode terminal forming surface is oriented toward the metallic foil 22 (toward the lower surface), the gold wire 16 in the vicinity of the electrode terminal 14 will be crushed by the metallic foil 22. Thus, the gold wire 16 thus crushed may be brought into contact with the gold wire 16 with its one end connected to an adjacent electrode terminal 14.

On the side surface of the stacked body P shown in FIG. 1, the side wiring electrically connecting the gold wires 16, 16, 16 extended out to the respective side surfaces of the semiconductor elements 10, 10, 10 is formed by applying a conductive paste in which conductive particles such as silver particles, copper particles or carbon particles are contained in resin such as thermosetting resin.

The wettability between the gold wire 16 and the conductive paste is satisfactory. For this reason, when the gold wire extended out to the side surface of the semiconductor element is brought into contact with the conductive paste, the conductive paste is likely to be collected on the periphery of the gold wire 10 so that contact of the pertinent side wiring with an adjacent side wiring can be avoided. Thus, reliability of the semiconductor apparatus finally produced can be improved.

The conductive paste is applied, as shown in FIG. 5, using a transferring wire 30. The transferring wire 30 is preferably a metallic transferring wire, particularly a tungsten transferring wire.

Figure 5A:
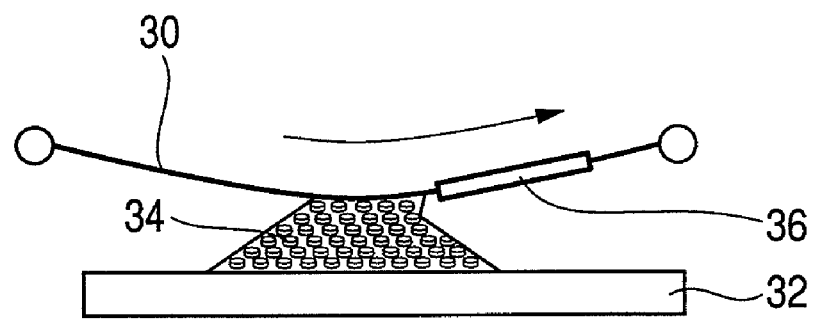
FIG. 5 is a process view for a transferring process.

In applying the conductive paste on the side surface of the stacked body P using the transferring wire 30, first, as shown in FIG. 5A, the transferring wire 30 is brought into contact with the liquid drops of the conductive paste dropped on a stand so that the conductive paste is deposited on the surface of the transferring wire 30 with the aide of the surface tension of the conductive paste forming the liquid drops 34. In this case, the transferring wire 30 is moved from the one end toward the other end (direction of arrow in FIG. 5A) so that the conductive paste is deposited over a predetermined length of the transferring wire 30.

Figure 5B:
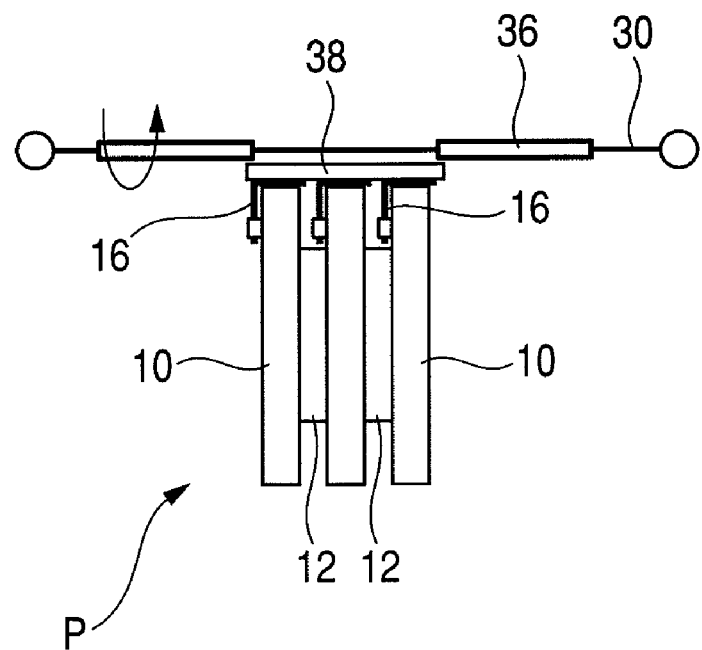

Next, as shown in FIG. 5B, the transferring wire 30 is pressed on the side surface of the stacked body P so that the conductive paste 36 deposited on the periphery of the transferring wire 30 is transferred onto the side surface of the stacked body P. A linear strip 38 of the conductive paste 36 transferred on the side surface of the stacked body P is heat-treated thereby to form the side wiring.

Now, in pressing the transferring wire 30 on the side surface of the stacked body P to transfer the conductive paste 36 onto the side surface of the stacked body P, by rotating the transferring wire 30 while giving tension thereto, the thickness of the side wiring formed can be made constant.

Figure 6:
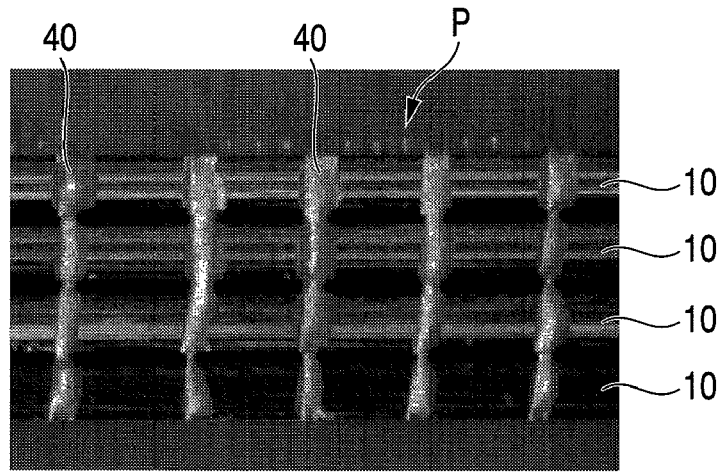
FIG. 6 is a microscope photograph showing the state of side wirings formed by transferring in the transferring process shown in FIG. 5.

The state where the side wirings are formed on the side surface of the stacked body P is shown in FIG. 6. FIG. 6 is a microscope photograph showing the state where side wirings 40, 40, . . . are formed by transferring the conductive paste using the transferring wire 30 having a thickness of 43 μm onto the stacked body P shown in FIG. 1 in which four semiconductor elements 10 each having a thickness of 200 μm are stacked through the adhesive layers 12.

This side wiring 40, 40, . . . is thinner than the semiconductor element 10 having a thickness of 200 μm. For this reason, although the pitches of the side wirings 40, 40 are 520 μm, the side wirings 40, 40, . . . can be formed even at the pitches of 260 μm.

Figure 7:
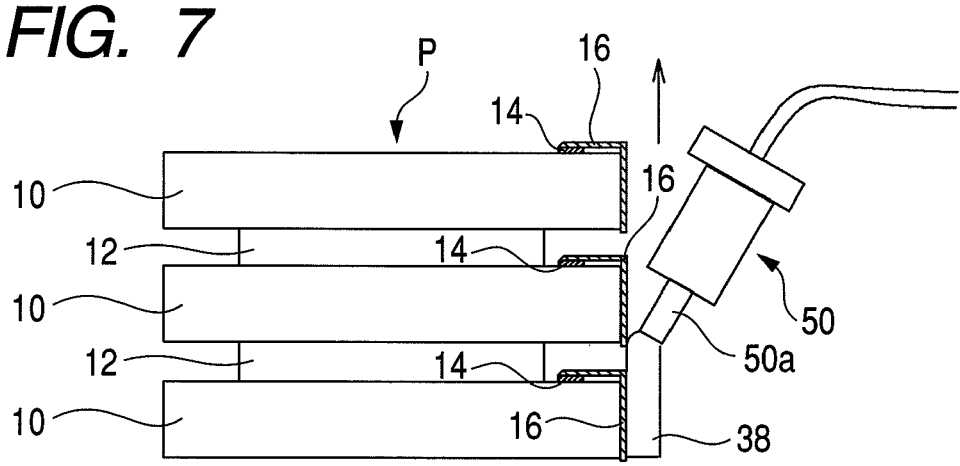
FIG. 7 is a view for explaining the method for spitting out a conductive paste from a nozzle to the side surface of the stacked body shown in FIG. 1.

Meanwhile, as shown in FIG. 7, where the side wirings are formed on the side surface of the stacked body P shown in FIG. 1 by spitting out the conductive paste from a nozzle 50a of an applying device 50, the side wirings become thick.

Figure 8:
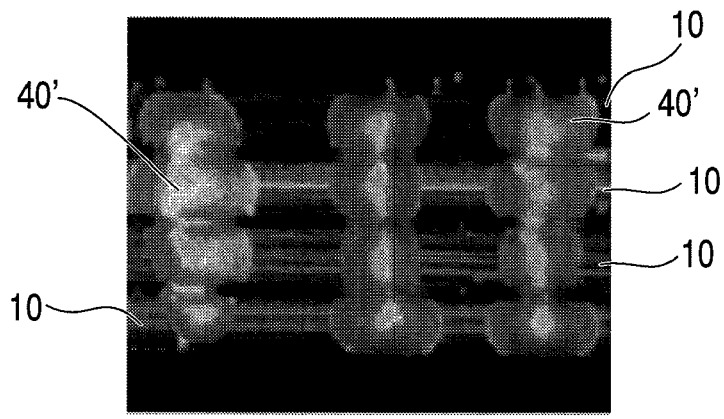
FIG. 8 is a microscope photograph showing the state of side wirings formed by spitting out the conductive paste from the nozzle shown in FIG. 7.

This is shown in FIG. 8. FIG. 8 is a microscope photograph showing the state where side wirings 40', 40', . . . are formed by spitting out the conductive paste from the nozzle 50a having a diameter of 150 μm of the applying device 50 onto the stacked body P shown in FIG. 1 in which four semiconductor elements 10 each having a thickness of 200 μm are stacked through the adhesive layers 12. As apparent from FIG. 8, the maximum width of the side wiring 40' is wider than the semiconductor element 10 having a thickness of 200 μm. Therefore, it is very difficult to set the pitches of the side wirings 40', 40' at 260 μm.

In the stacked body P shown in FIG. 1, the gold wire 16 is extended out to the side surface of each of the semiconductor elements 10 while being in contact therewith. However, as shown in FIG. 9, the gold wire 16 extended out to the side surface of the semiconductor element 10 may be extended to the surface opposite to the electrode terminal forming surface of the semiconductor element 10 where the electrode terminal 14 is formed.

Figure 9:
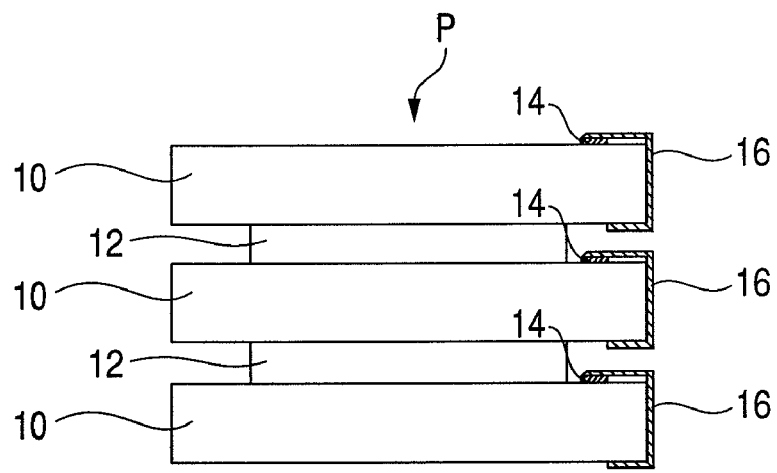
FIG. 9 is a schematic sectional view for explaining another example of the stacked body P employed in this invention.

In order to form the semiconductor element 10 shown in FIG. 9, as shown in FIG. 2, the semiconductor element 10 is placed on the through-hole 24 made in the metallic foil 22 placed on the sucking plate 20. By a wire bonder, the one end of the gold wire 16 is connected to the vicinity of the semiconductor element 10 of the metallic foil 22 fixed by the sucking force of the sucking plate 20. Thereafter, the gold wire 16 is pulled out from a capillary to connect its other end onto the electrode terminal 14 of the semiconductor element 10 and torn off.

Figure 10A:
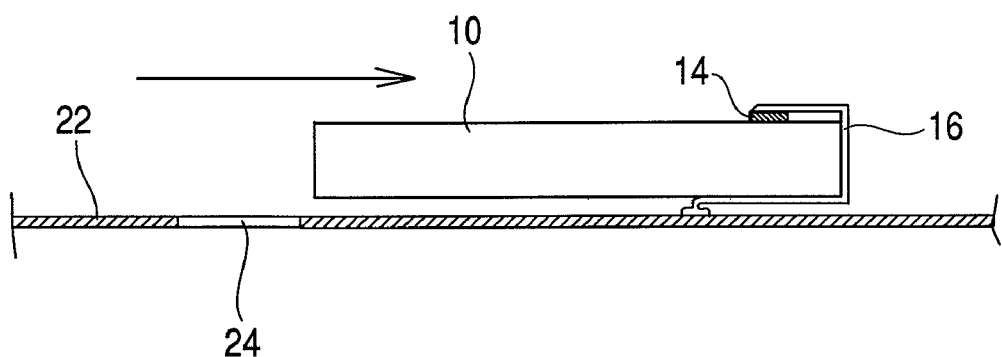
FIG. 10 is a process view of the semiconductor element constituting the stacked body shown in FIG. 9.

Next, as shown in FIG. 3A, the sucking of the sucking plate 20 is released to take out the semiconductor element 10 and metallic foil 22 from the sucking plate 20. Thereafter, as shown in FIG. 10A, the semiconductor element 10 is slid toward the gold wire 16 (direction of arrow in FIG. 10A). Thus, the side surface of the semiconductor element 10 is brought into contact with the gold wire 16 so that the gold wire 16 crosses the side surface of the semiconductor element 10 in its contact therewith.

The semiconductor element in the state shown in FIG. 10A can be obtained by rotating the semiconductor element 10 provided upright perpendicularly to the metallic foil 22 as shown in FIG. 3C by 90° so that its electrode terminal forming surface serves as an upper surface.

Figure 10B:
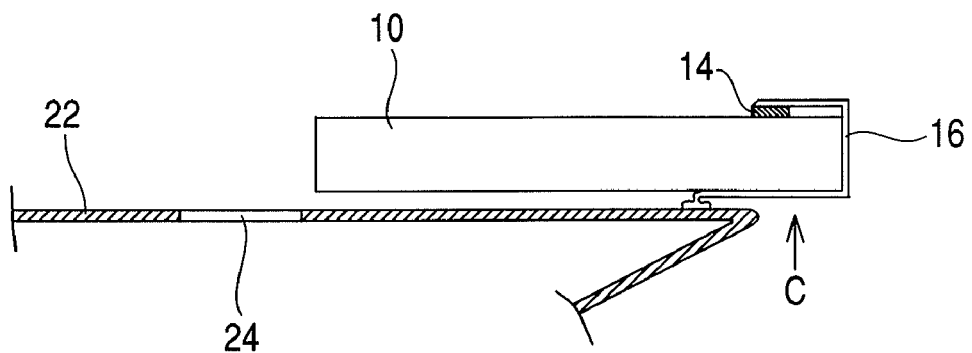

Thereafter, as shown in FIG. 10B, a part of the metallic foil 22 is bent so that the gold wire 16 extended to the surface opposite to the electrode terminal forming surface is exposed. Further, the portion of the gold wire 16 extended to the opposite surface of the semiconductor element 10 (portion in the vicinity of the corner of the opposite surface of the semiconductor element 10 (position C indicated by arrow)) is cut using e.g. a cutter. Thus, there is provided the semiconductor element 10 in which the gold wire 16 with the one end connected to the electrode terminal 14 crosses the side surface while being in contact therewith and is extended to the surface opposite to the electrode terminal forming surface.

Meanwhile, as shown in FIG. 10A, in sliding the semiconductor element 12 to extend out the gold wire 16 to the side surface of the semiconductor element 10, without extending out the gold wire 16 to the surface opposite to the electrode terminal forming surface of the semiconductor element 10, the gold wire 16 may be torn off at the corner of the electrode terminal forming plane. In this way, where the gold wire 16 is torn off, by previously making a scratch at a predetermined position of the gold wire 16 using e.g. a clip, the gold wire 16 can be easily cut at the predetermined position.

As shown in FIG. 9, plural semiconductor elements 10, 10, 10, in each of which the gold wire 16 with its one end connected to the electrode terminal 14 crosses the side surface and extended out to the surface opposite to the electrode terminal forming surface, are stacked to form a stacked body P through adhesive layers 12, 12 so that the respective electrode terminal forming surfaces with the electrode terminals 14 formed thereon are oriented in the same direction. In this case, the semiconductor elements 10, 10, 10 are adjusted in position so that the gold wires 16 extended out to the respective side surfaces of the semiconductor elements 10, 10, 10 are aligned with one another.

Next, as shown in FIG. 5B, using the transferring wire 30, the liner strip 38 of the conductive paste 36 is transferred on the side surface of the stacked body P and heat-treated thereby to form the side wiring 40.

In the stacked bodies shown in FIGS. 1 and 9, the gold wire 16 with the one end connected to the electrode terminal is extended out to the side surface while being in contact therewith to each of the side surfaces of the semiconductor elements 10, 10, 10 constituting the stacked body. However, the semiconductor elements 10 in which the other end of the gold wire with the one end connected to the electrode terminal 14 is projected toward the side surface as shown in FIG. 11 can be employed.

Figure 12:
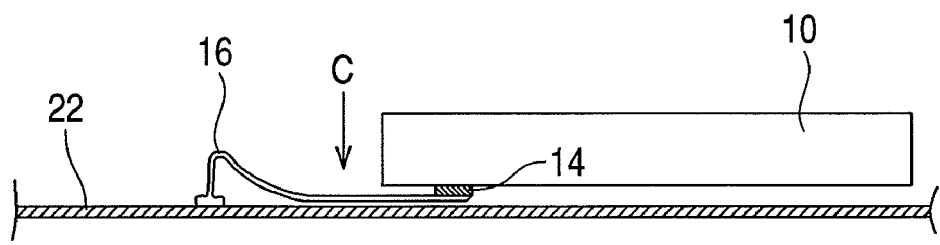
FIG. 12 is a process view of the semiconductor element 10 constituting the stacked body shown in FIG. 11.

Such a semiconductor element 10 can be obtained by cutting the portion of the linear strip of the gold wire 16 projected from the side surface of semiconductor element 10 (vicinity of the corner of the electrode terminal forming surface of the semiconductor element 10 (position C indicated by arrow)) as shown in FIG. 12 in a state where the electrode terminal forming plane is oriented toward the metallic foil 22 (toward the lower surface) by rotating the semiconductor element 10 by 180°, as shown in FIG. 3B.

Figure 13:
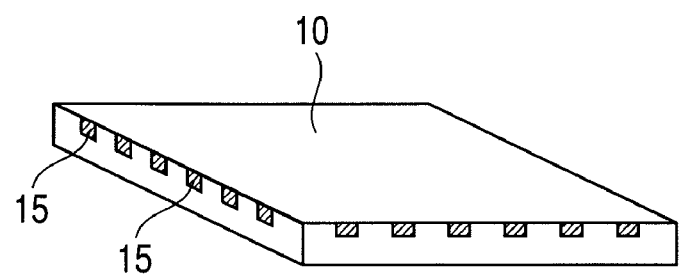
FIG. 13 is a schematic sectional view for explaining a further example of the stacked body P employed in this invention.
Figure 14:
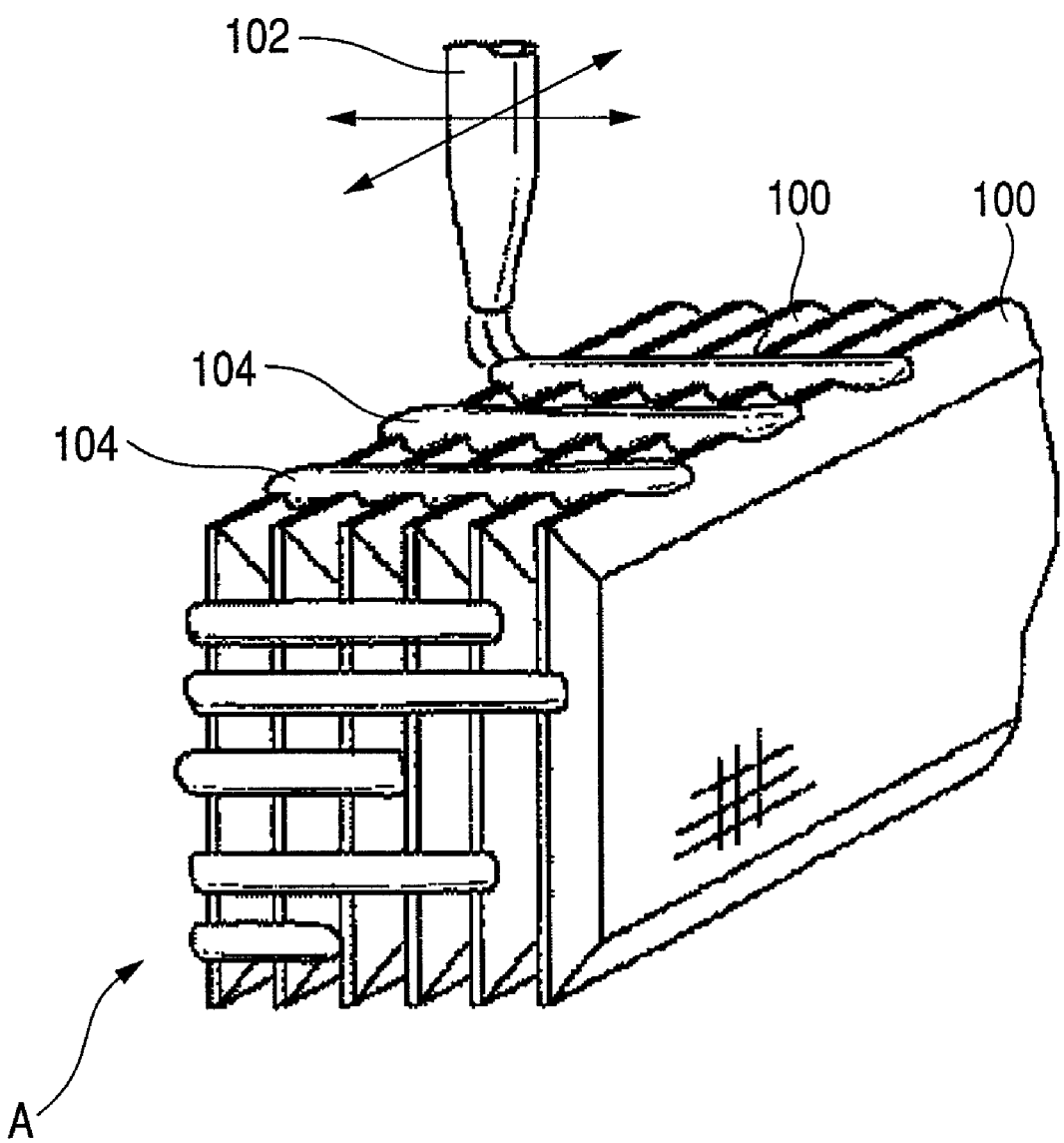
FIG. 14 is a perspective view for explaining a conventional method for forming side wirings by spitting out the conductive paste from a nozzle to the stacked body A including plural semiconductor elements.

As the semiconductor element 10 explained hitherto referring to FIGS. 1 to 12, the semiconductor element 10 in which the gold wire 16 with the one end connected to the electrode terminal 14 formed on the one main surface of the semiconductor element is extended out to the side surface is employed. However, as shown in FIG. 13, the semiconductor element 10 in which one end 15 of the wirings each with the one end connected to the electrode terminal 14 is exposed to the side surface may be employed.

Figure 11:
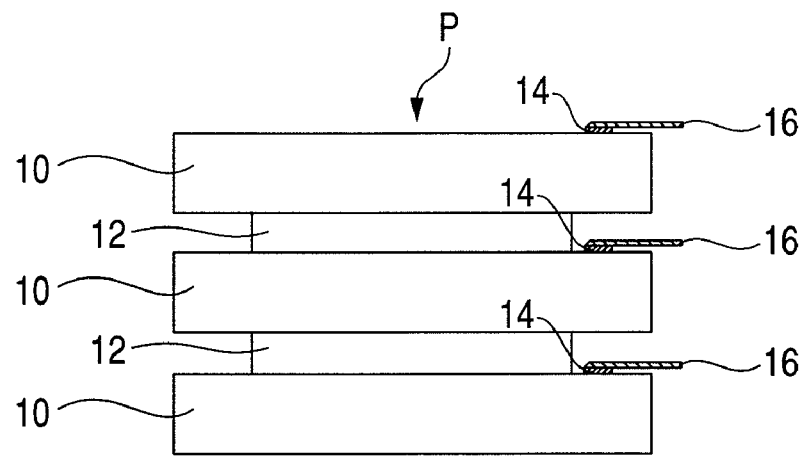
FIG. 11 is a schematic sectional view for explaining a still another example of the stacked body P employed in this invention.

Further, in the semiconductor apparatus P as shown in FIGS. 1, 9 and 11, the respective semiconductor elements 10, 10, . . . are stacked so that their electrode terminal forming surfaces are upper surfaces. However, the semiconductor elements 10, 10, . . . may be stacked so that the electrode terminal forming surfaces are opposite to each other.

Further, as the transferring wire 30, the metallic transferring wire 30 is employed. However, a resin transferring wire or a transferring wire with the surface subjected to the processing such as roughing may be employed.

What is claimed is:

1. A method for manufacturing a semiconductor apparatus comprising the steps of:
   stacking plural semiconductor elements to form a stacked body,
   forming side wirings on a side surface of the stacked body to manufacture the semiconductor apparatus in which the respective semiconductor elements are electrically connected to one another,
   as the semiconductor element, preparing a semiconductor element in which at least a part of a wiring with one end thereof connected to an electrode terminal of the semiconductor element is extended out or exposed to the side surface; and
   transferring a conductive paste containing conductive particles applied over a predetermined length of a transferring wire to the side surface of the stacked body so that the wirings extended out to the side surfaces of the semiconductor elements are connected to form the side wirings.

2. The method for manufacturing a semiconductor apparatus according to claim 1, wherein
   as the semiconductor element, a semiconductor element is employed in which at least a part of the wiring with one end thereof connected to an electrode terminal formed on one main surface thereof is extended out to the side surface.

3. The method for manufacturing a semiconductor apparatus according to claim 1, wherein
   as the semiconductor element, a semiconductor element is employed in which a wiring with one end thereof connected to an electrode terminal formed on one main surface of the semiconductor element is extended out to the side surface while being in contact therewith.

4. The method for manufacturing a semiconductor apparatus according to claim 3, wherein
   as the semiconductor element in which a wiring with one end thereof connected to an electrode terminal is extended out to the side surface while being in contact therewith, a semiconductor element is employed in which after the wiring is wire-bonded in a shooting-up system of connecting the other end of the wiring with the one end connected to a metallic foil on which the semiconductor element is mounted so that an electrode terminal forming surface with the electrode terminal formed thereon serves as an upper surface, to the electrode terminal of the semiconductor element;
   the semiconductor element is rotated so that the wiring is brought into contact with the side surface of the semiconductor element; and
   the wiring is cut at a predetermined position.

5. The method for manufacturing a semiconductor apparatus according to claim 1, wherein
   as the semiconductor element, a semiconductor element is employed in which a wiring with one end thereof connected to an electrode terminal formed on one main surface of the semiconductor element crosses the side surface while being in contact therewith and is extended out to a surface opposite to the one main surface.

6. The method for manufacturing a semiconductor apparatus according to claim 5, wherein as the semiconductor element with a wiring crossing the side surface while being in contact therewith and extending out to a surface opposite to an electrode terminal forming surface, a semiconductor element is employed in which after the wiring is wire-bonded in a shooting-up system of connecting the other end of the wiring with the one end connected to a metallic foil on which the semiconductor element is mounted so that the electrode terminal forming surface with the electrode terminal formed thereon serves as an upper surface, to the electrode terminal of the semiconductor element;

the semiconductor element is rotated or slid so that the wiring is brought into contact with the side surface of the semiconductor element and with the surface opposite to the electrode terminal forming surface; and the wiring is cut at a predetermined position.

7. The method for manufacturing a semiconductor apparatus according to claim 1, wherein in transferring the conductive paste applied on the transferring wire to the side surface of the stacked body, the transferring wire is rotated while being supplied with tension.

8. The method for manufacturing a semiconductor apparatus according to claim 1, wherein the transferring wire is a metallic transferring wire.

9. The method for manufacturing a semiconductor apparatus according to claim 1, wherein the wiring is a metal wiring.

* * * * *